US008043880B2

(12) United States Patent
Haluzak et al.

(10) Patent No.: US 8,043,880 B2
(45) Date of Patent: Oct. 25, 2011

(54) MICROELECTRONIC DEVICE

(75) Inventors: Charles C Haluzak, Corvallis, OR (US);
John R Sterner, Albany, OR (US);
Kirby Sand, Corvallis, OR (US)

(73) Assignee: Hewlett-Packard Development, L.P.,
Houston, TX (US)

( * ) Notice: Subject to any disclaimer, the term of this patent is extended or adjusted under 35 U.S.C. 154(b) by 1735 days.

(21) Appl. No.: 11/192,701

(22) Filed: Jul. 28, 2005

(65) Prior Publication Data

US 2007/0023890 A1    Feb. 1, 2007

(51) Int. Cl.
*H01L 21/00* (2006.01)
(52) U.S. Cl. ............ 438/50; 438/51; 438/53; 257/704; 257/710; 257/E21.001
(58) Field of Classification Search .............. 438/50, 438/51, 53; 257/704, 710, E21.001
See application file for complete search history.

(56) References Cited

U.S. PATENT DOCUMENTS

| 6,635,509 B1* | 10/2003 | Ouellet ................. 438/106 |
| 7,067,344 B1* | 6/2006 | Oguchi .................. 438/53 |
| 2004/0020782 A1* | 2/2004 | Cohen et al. ............ 205/223 |
| 2004/0100677 A1* | 5/2004 | Huibers et al. ........... 359/290 |
| 2004/0161871 A1* | 8/2004 | Omori ................... 438/68 |
| 2005/0263866 A1* | 12/2005 | Wan .................... 257/678 |
| 2006/0176487 A1* | 8/2006 | Cummings et al. ........ 356/445 |

OTHER PUBLICATIONS

Mund et al., Novel Microstructuring Technology for Glass on Silicon and Glass-Substrate, Electronic Components and Technology, IEEE 2004, pp. 939-942.*
Mund, Dietrich, Novel Microstructuring Technology for Glass on Silicon and Glass-Substrates, 2004 Electronic Components and Technology Conference, IEEE, 2004, p. 939-942.

* cited by examiner

*Primary Examiner* — Junghwa M Im

(57) ABSTRACT

One embodiment of a microelectronic component system includes a base adapted for supporting a microelectronic component, a membrane sealed to the base, and a glass lid built-up on the membrane and hermetically sealing the membrane.

18 Claims, 1 Drawing Sheet

MICROELECTRONIC DEVICE

BACKGROUND

Microelectronic devices, such as micro electromechanical systems (MEMS), may be hermetically sealed within a package to protect the microelectronic device from environmental hazards such as humidity, electrical interference, dust, physical contact, and the like. Providing a hermetically sealed atmosphere for the microelectronic device within the package may reduce the effect of environmental hazards on the device.

DETAILED DESCRIPTION OF THE DRAWINGS

Figure 1:
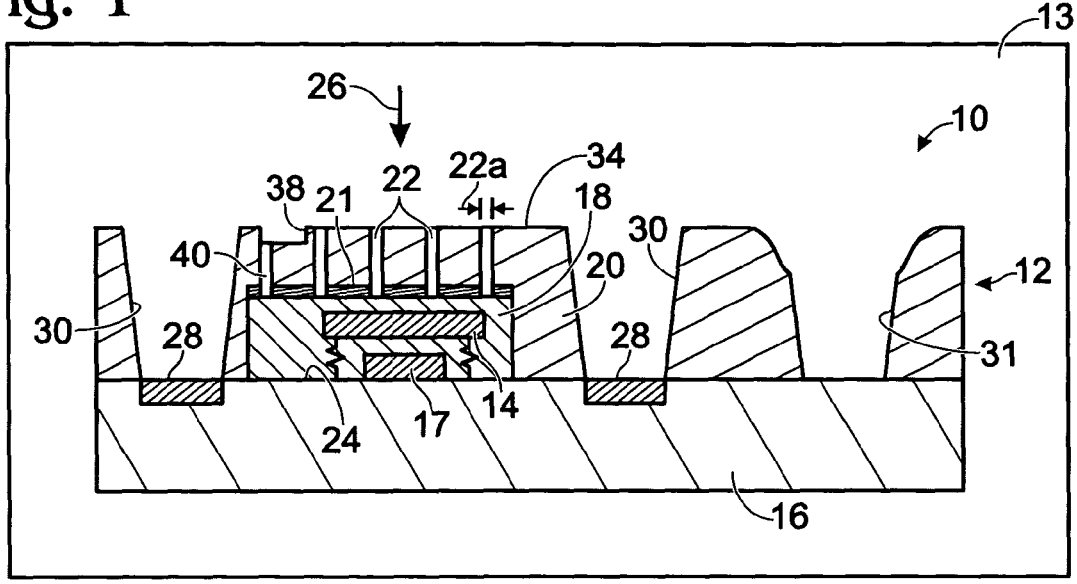
FIG. 1 is a schematic cross-sectional side view of one embodiment of a microelectronic device without a lid and with a movable microelectronic pixel plate in an unreleased condition.

FIG. 1 shows a cross-sectional view of one embodiment of an electronic component 10 including a package 12. In one embodiment, package 12 may include an image processing device for use in an image processing electronic product 13, for example, a television, a digital camera, a digital projector, a monitor, an electronic device display screen, or the like. The package 12 may include an exemplary digital light display (DLD) device with a movable MEMS device, such as an optical pixel plate 14, mounted on a support base 16 with a driving electrode 17. In the embodiment shown one pixel plate 14 is shown for ease of illustration. However, in other embodiments, an array of hundreds, thousands or more of movable MEMS devices, such as pixel plates, may be positioned on base 16 of electronic component 10.

Support base 16 may be manufactured of any suitable material, and in the embodiment shown, may be manufactured of silicon. Of course, other optical devices may be used, such as a liquid crystal display (LCD) or liquid crystal on silicon (LCOS), for example. While package 12 in the illustrated embodiment is an optical device, it will be understood by those skilled in the art that the invention is not limited to optical devices. Support base 16 may be made of a variety of materials, such as a semiconductor or a non-conductive substrate, and may have a thickness selected to provide sufficient strength to support the DLD pixel plate 14.

Pixel plate 14 may be encased within a sacrificial material 18 which may be enclosed by a protective membrane 20 mounted on support base 16. Sacrificial material 18 may be amorphous silicon, silicon dioxide, or photoresist, for example. Protective membrane 20 may be made of an oxide, such as tetraethoxysilane (TEOS), for example. While encased within sacrificial material 18, pixel plate 14 may be immovable or unreleased. In one embodiment, protective membrane 20 may have a partial reflective coating 21 on its bottom surface and may allow a portion of an incoming light to pass therethrough. The light may be reflected back from pixel plate 14 to generate a desirable interference color effect based on the gap between pixel plate 14 and protective membrane 20.

Protective membrane 20 may include one or more etch release holes 22 that may extend from a cavity 24 enclosing therein sacrificial material 18 and pixel plate 14. Etch release holes 22 may define a diameter 22a that may be sufficiently small in size such that some types of liquid may not easily flow through the holes but which may allow the flow of some liquids and gases therethrough. A release gas or fluid 26 (which may be referred to collectively as a gas for ease of description) may be introduced to etch release holes 22 and to sacrificial material 18 within cavity 24. Release gas or fluid 26 may be any material suitable to break down sacrificial material 18, such as Xenon Difluoride (XeF2), for sacrificial silicon, for example. Accordingly, release gas or fluid 26 may break down and remove sacrificial material 18 from cavity 24 through etch release holes 22 such that pixel plate 14 may be positioned in a gas or a fluid within cavity 24 of membrane 20. In this condition, pixel plate 14 may be referred to as movable or released (see FIG. 2), i.e., pixel plate 14 may be moved by driving electrode 17.

Base 16 may include bond pads 28 that may be exposed through an aperture or via 30 of protective membrane 20. Bond pads 28 may be manufactured of an electrical bondable material, such as a metal, for example. The bond pads may be utilized to bond connection leads (not shown) to device 10 after packaging of the device.

Figure 2:
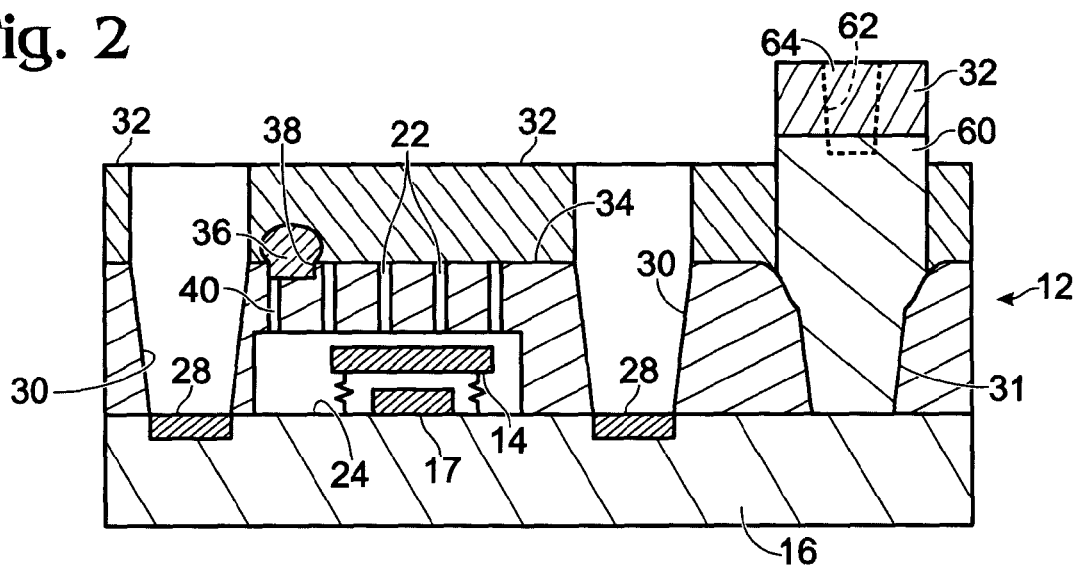
FIG. 2 is a schematic cross-sectional side view of one embodiment of a microelectronic device with a lid and with a movable microelectronic pixel plate in a released condition.

FIG. 2 shows one embodiment of microelectronic device 10 with pixel plate 14 in a released condition. After release gas or fluid 26 is introduced to cavity 24 through holes 22, and after sacrificial material 18 is removed therefrom, it may be desirable to hermetically seal holes 22 to protect pixel plate 14 from environmental hazards, such as humidity, electrical interference, dust, physical contact, and to maintain a novel or non-ambient gas mixture in the package, and the like. To seal holes 22 and to physically protect membrane 20, a lid 32 may be formed on and covering a top surface 34 of protective membrane 20 in the region of pixel plate 14. In the embodiment of an optical device, lid 32 may be adapted to allow light to pass therethrough and, therefore, may be manufactured of glass or another such transparent or semi-transparent material or materials. For example, lid 32 may be manufactured of one of Standard Glass, Alkaline Free Glass, Low Loss Glass, High CTE Glass, and High nd (neutral density) Glass, for example.

Still referring to FIG. 2, in one embodiment, a reactive material 36, such as a getter, namely a desiccant, and/or an anti-stiction material, may be positioned in and on a depression 38 formed on protective membrane 20. In another embodiment, the getter or anti-stiction material may be placed on top of protective membrane 20 without the use of depression 38. Getter and/or anti-stiction material 36 may be connected to cavity 24 and other cavities (not shown) of device 10 by fluidic pathways 40 through protective membrane 20. It may be desirable to seal a top surface of getter 36 so that the getter and/or anti-stiction material will not be subjected to external environmental conditions, such as humidity. Accordingly, lid 32 may extend over and completely cover getter and/or anti-stiction material 36 positioned in depression 38 of membrane 20. The getter may be a desiccant that may be manufactured of HiCap 2000, or HiCap 2100, for example, and an anti-stiction material may be manufactured of Fluorinated Octyltrichlorosilane (FOTS), or Fluorinated Decyltrichlosilane (FDTS), for example.

Figure 3:
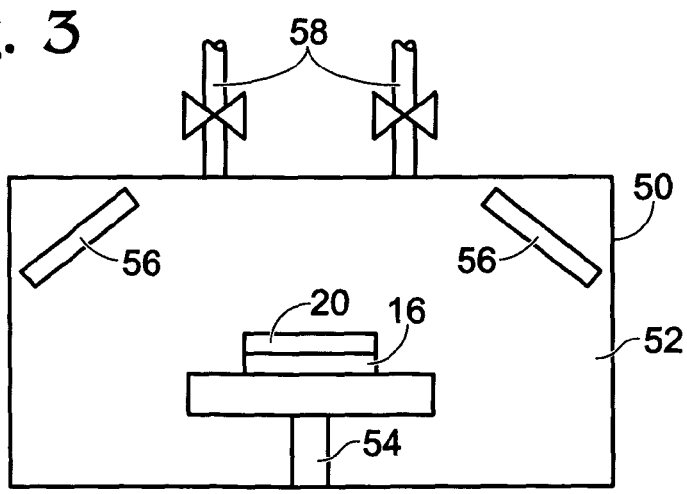
FIG. 3 is a schematic cross-sectional side view of one embodiment of a deposition chamber for depositing a lid of the device of FIG. 2.

FIG. 3 shows one embodiment of a deposition chamber 50 and one method utilized in the formation of lid 32. In the embodiment shown, lid 32 may be a glass material, such as a layer of glass, built-up on protective membrane 20 by physical vapor deposition (PVD) and/or plasma ion assisted deposition (PIAD) utilizing one or more targets, such as glass targets. Deposition chamber 50 may include an interior 52 having a support 54 positioned therein for supporting base 16. One or more targets 56 may be positioned within interior 52. Targets 56 may be manufactured of a glass such as synthesized glass, namely, Borofloat 33™ from Schott, or, Eagle 2000™ from Corning, or the like, for example. Deposition chamber 50 may further include one or more inlet/outlet gas valves 58 through which a gas or a plasma may be introduced to interior 52 of the chamber. Prior to the formation of lid 32, chamber 50 may also be utilized for the formation of pixel plate 14, driving electrode 17, protective membrane 20, or other components of device 10 (not shown) on base 16.

Prior to formation of lid 32, a photoresist 60 (shown in saw street 31 of FIG. 2) may be positioned within bond pad vias 30 and along saw streets 31 of base 16 wherein the resist may be removed to expose bond pads 28 and saw streets 31 after formation of lid 32. In particular, resist 60 may be formed within saw street 31 as shown in FIG. 2 (For ease of illustration, the resist and the process of removing the same is only shown in saw street 31. However, the same technique to expose saw street 31 may also be utilized to expose bond pads 28 in via 30). The top surface of resist material 60 formed in via 31 may be positioned above the top surface 34 of protective membrane 20. Accordingly, when lid 32 is formed on protective membrane 20 and resist 60, the glass material of lid 32 formed in the region of saw street 31 may be positioned on top of resist material 60 and may be physically separated or discontinuous with the glass material of lid 32 formed in other regions of protective membrane 20. A saw cut, or any other mechanical removal method, may then be employed to make a cut 62 (indicated by dash lines 62 in FIG. 2) through lid 32 and into resist material 60 such that material 64 within the saw cut area is removed from saw street 31. A lift off process may then be utilized to remove the remainder of resist 60 (which is exposed through lid 32 by the saw cut), which will also result in the removal of the portion of lid 32 positioned on resist 60 in the region of saw street 31. After the lift off process and removal of resist 60, saw street 31 (and/or bond pads 28 in the case of resist removal within via 30) will be exposed.

In this manner, bond pads 28 and saw streets 31 may be accessible through lid 32 after formation thereof. However, protective membrane 20 and pixel plate 14 will be hermetically and physically sealed by lid 32 from environmental hazards, such as from the debris generated during die singulation down saw streets 31. Accordingly, released pixel plate 14 is physically protected from the potentially damaging activity of die singulation. The resist material or materials 60 and the process step or steps utilized may be any materials and process steps suitable for protecting and then exposing bond pads 28 and saw streets 31.

Still referring to FIG. 3, several embodiments of the process of forming lid 32 will be discussed. The process may be described at the wafer level wherein base 16 includes multiple electrical components 10 thereon.

In a first phase of the process, base 16 is provided. In one embodiment base 16 may be provided having pixel plate 14 and protective membrane 20 positioned thereon. Etch release holes 22, bond pad vias 30 and saw street apertures 31 may be formed in membrane 20. Pixel plate 14 may be released and, therefore, may be positioned in a gas within cavity 24, wherein sacrificial material 18 has been removed. Getter and/or anti-stiction material 36 may be positioned in one or more depressions 38 or on top of protective membrane 20, wherein the getter and/or anti-stiction material may be in communication with cavity 24 through one or more fluidic pathways 40.

In a second phase of the process, a liquid based photoresist 60 or dry-film laminate may be applied to the completed CMOS or MEMS wafer 16 to mask areas as desired.

In one option of this second phase, anti-stiction material 36 may be added by chemical vapor deposition (CVD) to cavity 24 through etch release holes 22 or through fluid pathway 40. The anti-stiction material may then be plasma-cleaned from the top surface 34 of protective membrane 20 prior to formation of lid 32 thereon. In another embodiment, top surface 34 may not be cleaned because the formation process of lid 32 may act to perform a self-clean of top surface 34. Lid 32 may then be formed across the entire wafer, including across the entirety of base 16, including bond pads 28 and saw streets 31, if the bond pads and saw streets are masked.

In a second option of the second phase, the glass may be deposited directly on the entire wafer 16, bond pads 28 and saw streets 31, wherein the glass may be removed from the bond pads 28 and saw streets 31 by patterning in a subsequent process step.

In a third phase of the process, photoresist 60 may be patterned and developed to protect bond pads 28 and/or saw streets 31 and any other area on CMOS/MEMS base 16 that does not require hermetic packaging and/or a strong physical barrier. It may be beneficial to not deposit lid 32 in the saw streets to avoid physical de-lamination of lid 32 by the subsequent strenuous saw process in the silicon-street area. This is the same photoresist 60 that may be used for lift-off after formation of lid 32.

In one option of this third phase, if MEMS device 14 is un-released, rigorous wet processes, or even plasma ashing, may be utilized to clean the photoresist from bond pad holes 30 and saw holes 31. Wet processing or even plasma ashing may also be utilized to thoroughly clean top surface 34 of MEMS protective membrane 20 for improved adhesion of lid 32. If this is done, then phase 4 described below may begin with a sacrificial silicon release process using XeF2 gas in a CVD reactor.

In another option of this third phase, getter 36 may be dispensed on depression 38 or into open "dummy" pixels with horizontally established channels from the active array, through the dummy array, to where the desiccant is dispensed. The getter may then be thermally activated. In a fourth phase of the process, lid 32 may be deposited on protective membrane 20 along top surface 34. The deposition of lid 32 may follow the procedure set forth in the article entitled Novel Microstructuring Technology for Glass on Silicon and Glass-Substrates, by Dietrich Mund and Dr. Jurgen Leib of Schott Electronic Packaging GmbH, IEEE 2004 Electronic Components and Technology Conference, page 939, herein incorporated in whole by reference. In particular, the glass may be deposited by physical vapor deposition and/or with plasma ion assisted deposition (PVD-PIAD or PIAD) of special synthesized glass targets in a vacuum within the deposition chamber. The glass targets may be a synthesized alkaline containing borosilicate glass having a coefficient of thermal expansion (CTE) of 2.8 part per million per degree Celsius (ppm/° C.), an alkaline containing borosilicate glass having a CTE of 3.2 ppm/° C., or an alkaline free borosilicate glass having a CTE of 1.3 ppm/° C., for example. In particular, the synthesized glass may be synthesized to have a coefficient of thermal expansion and/or a refractive index that is substantially the same as (e.g., within five percent of), i.e., that matches, the coefficient of thermal expansion and/or the refractive index of protective membrane 20. Accordingly, in the case of optical devices wherein the index of refraction is the same for lid 32 and protective membrane 22, there may be no image distortion at the interface between lid 32 and membrane 20. Accordingly, there may be no loss of light at the interface, which may result in a brighter image on the image processing device in which lid 32 is utilized. The deposition rate of the process may be approximately 0.1 to 1.0 micrometer/minute (um/min), may provide a layer thickness of 0.1 to 50 um and may be deposited at a low substrate temperature, such as 120 degrees Celsius or less. The process pressure may be a vacuum. The wafer size may be in the range of four inch to twelve inch wafers. The deposited glass layer 32 may be hermetic according to the Mil-Std 883 in a range lower than 10e-8 millibars-He per second (mbar/second).

In a fifth phase of the process, the glass lid 32 may be cleared from bond pads 28 and/or saw streets 31, and any other area of MSG deposit, by completing the photoresist dissolution using any appropriate lift-off develop methods.

In one option of this fifth phase, base 16 may be sawed through the glass lid 32 using the saw processes' depth control to stay appropriately within resist 60 and above the functional bond pad metal 28. Developer may then be used to clear any pre-sawn areas of the remaining resist 60.

In another option of this fifth phase, if a glass lift-off is not used, i.e., if the glass layer is deposited over the entirety of the wafer, then an appropriate resist process may be used to clear the glass material 32 from bond pads 28. For example, if gold (Au) bond pads were used, a buffered oxide etch would clear the glass material 32 with no physical damage to the noble-metal pads 28.

In a sixth phase of the process, silicon singulation can proceed with substantially no damage to the CMOS/MEMS device 14 because device 14 is now packaged within the glass layer 32. Additionally, it may be beneficial to reduce scratches and particle-embedding on lid 32 by laminating the glass lid 32 surface face down on the saw sticky-tape/frame for silicon singulation.

There are many advantages of the inventive process. In particular, one advantage of the glass-based deposition process is that the inventive glass deposition process is tolerant of the presence of particles and/or gas bubbles. The current processes of providing lid 32 may include securing a solid piece of glass by plasma-assisted bonding to protective membrane 20. In such a process, a hermetic seal may only be created if the top surface 34 of protective membrane 20 and the lower surface of the solid glass piece are atomically smoothed prior to placement together. Moreover, the solid piece of glass and protective membrane 20 may form a hermetic seal only if there are no particles or air gaps positioned therebetween. In particular, for plasma-assisted bonding, a particle or an air gap may have the effect of causing a de-bonded area that is much larger than the particle itself, thus creating substantially more apparent optical degradation of performance than is proportional to the diameter of the particle. However, in the inventive process wherein glass is built up on membrane 20 by deposition, instead of by placement of a pre-formed solid piece of glass on membrane 20, any particles present may not prevent a hermetic seal but may only have a local effect by either causing a localized refractive index mismatch or simply being opaque to the required light transmission in the MEMS array optical path in the localized area of the particle. Because this invention may use an ion-assisted evaporated glass deposition in a vacuum, there is not as much of a chance for gas trapping as may occur for plasma-assisted bonding that is either at, or only slightly below, ambient pressure. During plasma-assisted bonding, one or more bonding wave fronts may cause elastic ripples and/or trapped gas pockets between the protective membrane 20 and the solid piece of glass. Because the glass deposition process does not include a rigid substrate there is no mechanical analogy to the bond wave front distortions that may cause mechanical deformations, which may lead to trapped gas pockets as in plasma-assisted bonding of the current rigid glass process.

A second advantage of the inventive glass-based deposition process is that the process is "low temperature", occurring at approximately 120 degrees Celsius or less, such as at approximately 100 degrees Celsius. This is about 100 degrees cooler than the current plasma-assisted bonding, and approximately 150 degrees cooler than the final annealing temperature for wafer-level plasma-assisted membrane bonding, which is a currently utilized process for packaging optical devices. Most temperature-based CMOS/MEMS degradation processes, both chemical and physical, are Arrhenius (exponential) in nature. Accordingly, a doubling of the process temperature may have a profound negative impact on the circuits and/or MEMS devices 14, due to chemical changes and/or intrinsic stress changes in many thinfilm/MEMS layers and in the substrates themselves.

A third advantage of the inventive glass-based deposition process is that the process may not require the added expense of thick oxide depositions, which may typically be deposited at over twice the final (post-CMP) oxide thickness. This advantage is doubly true for optical device glass-to-silicon-membrane bonding because a thick TEOS layer may be deposited and chemically mechanically polished (CMP) on both substrates, at a substantial cost. This additional material may be used as a planarizing layer for CMP steps required to reach global planarity/flatness and sub-nanometer local roughness. The current optical device plasma-assisted bonding process may require both substrates (the solid glass plate and the silicon protective membrane) to have a roughness of less than 0.5 nanometers (nm). Because the inventive glass-based deposition process is a conformal deposition, and no additional rigid substrate (glass) is be bonded to it, a level of smoothness of the current process may not be required. Furthermore, because the current process may use an index matching medium between the CMOS/MEMS/PKG chip and the optical prism), it may not be necessary that the final "top" glass surface be flat or smooth, because, typical index matching optical liquids are "self-healing" in regards to such surface abnormalities, due to fluidic conformality, and refractive index match.

A fourth advantage of the inventive glass-based deposition process is that the process does not utilize another substrate at all. This has an advantage from a pure indirect materials cost and fabrication complexity. Furthermore, transparent glass wafers are not standard in the CMOS or MEMS industry, nor in the largest industry that uses these glass types, such as utilized for LCD, LCOS, Plasma, and DMD™, display or light modulator assemblies. Most CMOS/MEMS FAB tooling is not set-up to handle transparent glass wafers because the tooling may cause problems for light based sensors, and/or highly resistive substrates. Modifying the FAB tooling to handle such transparent glass wafers may be expensive and time consuming but is not utilized in the glass-based deposition process of the present invention.

The foregoing description of embodiments of the invention have been presented for purposes of illustration and description. It is not intended to be exhaustive or to limit the invention to the precise form disclosed, and modifications and variation are possible in light of the above teachings or may be acquired from practice of the invention. The embodiment was chosen and described in order to explain the principles of the invention and its practical application to enable one skilled in the art to utilize the invention in various embodiments and with various modification as are suited to the particular use contemplated. It is intended that the scope of the invention be defined by the claims appended hereto and their equivalents.

We claim:

1. A method of covering a microelectronic device, comprising:
   placing a membrane over a microelectromechanical system (MEMS) device, said membrane including at least one etch release hole extending therethrough;
   depositing photoresist over a bond pad corresponding to said MEMS device such that a top of surface of said photoresist deposited over said bond pad is at a different height than a top surface of said membrane placed over said MEMS device;
   depositing a layer of glass on said membrane and on said photoresist over said bond pad by physical vapor deposition using a glass target thereby forming a first glass lid covering said membrane and a second glass lid covering said photoresist over said bond pad, said first glass lid extending across said membrane and covering said at least one etch release hole, said first glass lid and said second glass lid being physically separate from each other; and
   selectively removing at least a portion of said second glass lid and said photoresist over said bond pad to expose said bond pad.

2. The method of claim 1, prior to depositing said layer of glass on said membrane and said photoresist over said bond pad, exposing said membrane to a release gas, said release gas moving through said at least one etch release hole to release said MEMS device.

3. The method of claim 1 wherein said movable MEMS device is a movable micro mirror optical device.

4. The method of claim 1, prior to depositing said layer of glass on said membrane and said photoresist over said bond pad, further comprising forming a getter on said membrane, and wherein said step of depositing said layer of glass includes covering said getter with said first glass lid.

5. The method of claim 1 wherein said layer of glass is deposited on said membrane and said photoresist over said bond pad at a temperature of at most one hundred and twenty degrees Celsius.

6. The method of claim 1 wherein said layer of glass is deposited on said membrane and said photoresist over said bond pad at a rate of between 0.1 micrometer to 1.0 micrometer per minute in a vacuum.

7. The method of claim 1, prior to depositing said layer of glass on said membrane and said photoresist over said bond pad, exposing said membrane to an anti-stiction material, said anti-stiction material in fluidic communication with said MEMS device moving through said at least one etch release hole to said MEMS device.

8. The method of claim 1 wherein said selective removal of at least a portion of said second glass lid and said photoresist over said bond pad to expose said bond pad comprises mechanically removing a portion of said second glass lid in a region of said bond pad, and thereafter chemically removing a portion of said photoresist over said bond pad to expose said bond pad.

9. The method of claim 1, wherein a bottom surface of said membrane comprises a partially reflective coating.

10. The method of claim 1, wherein said MEMS device is formed on a substrate, and further comprising depositing said photoresist over a saw street of said substrate such that a top surface of said photoresist over said saw street is at a different height than said top surface of said membrane placed over said MEMS device.

11. A method of hermetically sealing a MEMS device, comprising:
    forming a MEMS device on a substrate, said MEMS device embedded in a sacrificial material;
    forming a membrane on said sacrificial material, said membrane including a plurality of holes extending therethrough;
    exposing said plurality of holes to a release gas, said release gas removing said sacrificial material from said MEMS device through said plurality of holes so as to release said MEMS device;
    depositing photoresist over a bond pad corresponding to said MEMS device in said substrate such that a top surface of said photoresist over said bond pad is at a different height than a top surface of said membrane placed over said MEMS device;
    depositing a layer of glass over said membrane and said photoresist over said bond pad to form a first glass lid covering said membrane and a second glass lid covering said photoresist over said bond pad, said first glass lid sealing said plurality of holes to hermetically seal said MEMS device, said first glass lid and said second glass lid being physically separate from each other; and
    selectively removing at least a portion of said second glass lid and said photoresist over said bond pad to expose said bond pad.

12. The method of claim 11, prior to depositing said layer of glass over said membrane and said photoresist over said at least one bond pad, further comprising depositing a getter on said membrane, and said step of building-up said glass lid comprising building-up said glass cover over said getter.

13. The method of claim 10, further comprising depositing said layer of glass on said photoresist over said saw street, thereby forming a third glass lid over said saw street, said third glass lid being physically separate from said first glass lid and said second glass lid.

14. The method of claim 13, further comprising selectively removing at least a portion of said third lid and said photoresist over said saw street to expose said saw street.

15. The method of claim 11, wherein a bottom surface of said membrane comprises a partially reflective coating.

16. The method of claim 11, further comprising depositing said photoresist over a saw street of said substrate such that a top surface of said photoresist over said saw street is at a different height than said top surface of said membrane placed over said MEMS device.

17. The method of claim 16, further comprising depositing said layer of glass on said photoresist over said saw street, thereby forming a third glass lid over said saw street, said third glass lid being physically separate from said first glass lid and said second glass lid.

18. The method of claim 17, further comprising selectively removing at least a portion of said third lid and said photoresist over said saw street to expose said saw street.

* * * * *

UNITED STATES PATENT AND TRADEMARK OFFICE
CERTIFICATE OF CORRECTION

| | | |
|---|---|---|
| PATENT NO. | : 8,043,880 B2 | Page 1 of 1 |
| APPLICATION NO. | : 11/192701 | |
| DATED | : October 25, 2011 | |
| INVENTOR(S) | : Charles C Haluzak et al. | |

It is certified that error appears in the above-identified patent and that said Letters Patent is hereby corrected as shown below:

In column 7, line 32, in Claim 3, after "said" delete "movable".

Signed and Sealed this
Fourth Day of September, 2012

David J. Kappos
*Director of the United States Patent and Trademark Office*